June 11, 1963 B. CORNELISON ETAL 3,092,893
FABRICATION OF SEMICONDUCTOR DEVICES
Filed Feb. 13, 1958 2 Sheets-Sheet 1

INVENTOR
BOYD CORNELISON
JAY W. THORNHILL
ELMER A. WOLFF, JR.
BY Stevens, Davis, Miller & Mosher
ATTORNEYS

FABRICATION OF SEMICONDUCTOR DEVICES

Filed Feb. 13, 1958 2 Sheets-Sheet 2

INVENTOR
BOYD CORNELISON
JAY W. THORNHILL
ELMER A. WOLFF, JR.
BY Stevens, Davis, Miller & Mosher
ATTORNEYS United States Patent Office 3,092,893

Patented June 11, 1963

3,092,893

FABRICATION OF SEMICONDUCTOR DEVICES

Boyd Cornelison, Jay W. Thornhill, and Elmer A. Wolff, Jr., Dallas, Tex., assignors to Texas Instruments Incorporated, Dallas, Tex., a corporation of Delaware Filed Feb. 13, 1958, Ser. No. 715,040
4 Claims. (Cl. 29—25.3)

The present invention relates to a novel method for making semiconductor device assemblies and especially transistor assemblies, to a novel manner of mounting a transistor device and to the article resulting from the practice of the above indicated methods.

In the production of certain semiconductor devices, difficulty is encountered in the handling and mounting of the devices. This is especially true regarding wafers since they are exceedingly small, difficult to handle and display a lack of mechanical strength. One particularly important problem along this line confronting manufacturers in this field is the difficulty of attaching leads to the regions of a wafer constituting the various parts of a transistor. Various techniques are used at the present time to attach the leads to the wafer. Whereas the actual attachment from an electrical standpoint is satisfactory, the particular manner of accomplishing the attachment results in a bond of low mechanical strength, especially when the attachment is by means of compression bonding. This fact takes on much significance when it is recalled to mind that the transistor wafer may have to be subjected to several process steps after the leads are attached but before the unit is mounted in its header. Also, the process of mounting the unit in the header quite often requires that the leads be bent with the result that the bond is subjected to abnormal stresses often causing failure of the bond.

A further problem that has plagued the semiconductor art since its inception is the inability of workers in this field to develop manufacturing techniques that lend themselves to mechanization and thereby relieve the necessity for performing nearly all fabrication techniques by hand. It is recognized by all that present methods are tedious, time-consuming and are much too costly. In short, mass production techniques are desperately needed to lower costs and thereby increase the scope and range of present markets for semiconductor devices and to enable their entry into new markets.

The present invention provides a method and means for fabricating transistor devices including the positioning and attachment of the electrical leads through the use of a rigid and unitary frame means that facilitates subsequent handling and mounting in a support, such as a header, whereby the leads and the bonds joining the leads to the transistor will be safeguarded from the stresses and strains which would otherwise be placed on them resulting from the necessary subsequent operations and the handling incident thereto and which could cause failure of the bonds joining the leads to the transistor or the leads themselves.

Hence, it is the principal object and aim of the present invention to provide a novel method for making semiconductor device assemblies which avoids the difficulties heretofore experienced in the handling, mounting and supporting of wafers and other small semiconductor configurations.

It is also a prime object of the present invention to provide a unique method for assembling a transistor device employing a specially designed frame means for protectively supporting the transistor device and attached leads during subsequent operations, which operations are conducive to damage to the leads and the bonds joining the leads to the transistor device. The method of the invention enables a number of steps to be performed mechanically rather than by hand and thus is adaptable to high production, low cost operation.

Other objects and advantages of the invention will become more apparent from the following detailed description of a single preferred embodiment of the present invention when taken in conjunction with the appended drawings in which.

For the purpose of clarity and simplicity the following description will be confined to a consideration of a single preferred embodiment of the present invention. It is fully appreciated, however, that many changes and various modifications can be made or will be suggested to those skilled in this art which, in fact, do not depart from the basic concepts herein taught and disclosed. Such changes and modifications, if embodying the concepts of the invention are deemed to come within the purview of the invention and claim to them is made at this time. For example, the invention is described with reference to a three element transistor device. The invention includes other multielement configurations such as a four element device (tetrode).

Figure 1:
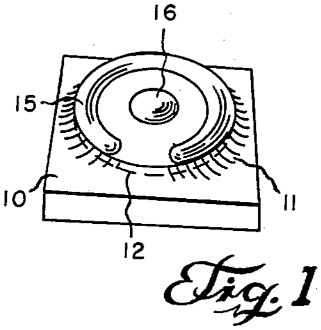
FIGURE 1 represents in perspective a typical transistor device prior to attachment of the electrical leads.

Referring now to the drawings, there is illustrated in FIGURE 1, in perspective, a transistor device consisting of a wafer portion 10 having formed on the top surface thereof a mesa or plateau 11. A diffused junction is defined in the plateau or mesa 11 as indicated by the reference numeral 12. The wafer portion 10 is of either *n* or *p* type conductivity containing therein any suitable active impurity. The semiconductor material for the transistor is either silicon, germanium or any other suitable material useful for this purpose. The region above the junction 12 is characterized by a conductivity opposite in type to the conductivity of wafer 10. Contact is made to the region above junction 12 by means of a horseshoe shaped contact 15. This contact has an outer diameter of approximately 10 mils. Centrally contained within the horseshoe shaped contact 15 and attached to the mesa 11 is a dot 16 approximately 2½ mils in diameter. The dot 16 functions as an emitter contact and the horseshoe shaped contact 15 functions as a base contact. Junction 12 functions as the base-collector junction. Although not shown, a base-emitter junction is present in the device by reason of an alloy and/or diffusion treatment of the wafer. For purposes of discussion it can be assumed that dot 16 contains an active impurity of the same conductivity producing type as contained in wafer 10 and is alloyed to mesa 11 to form an alloyed base-emitter junction.

Figure 2:
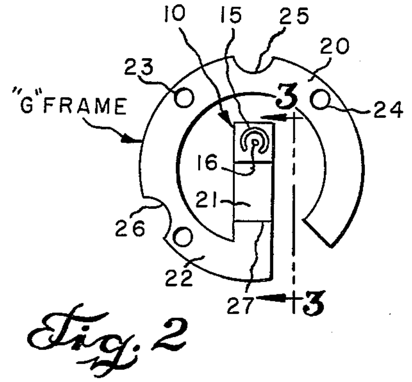
FIGURE 2 represents in top plan a G frame with the device of FIGURE 1 mounted thereon.
Figure 3:
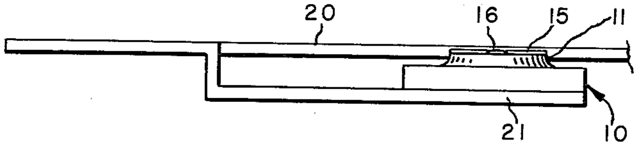
FIGURE 3 is a view in side elevation of the assembly illustrated in FIGURE 2.

The mounting for the transistor device will now be described in detail with particular reference to FIGURES 2 and 3. A G frame consisting essentially of a circular arcuate strip 20 connected at one end by means of a web or riser 27 to one end of a straight strip 21. The arcuate strip 20 is characterized by three holes designated respectively as 22, 23 and 24. These holes are so arranged that they constitute three corners of a square pattern, the pattern now commonly used as the arrangement of the several leads of a conventional transistor header. In addition, two cutout regions are present as indicated as indicated by the numerals 25 and 26 in between successive holes. The strip 21 extends inwardly with respect to the arcuate strip 20 and terminates spaced from the inner edge of the arcuate strip 20. The semiconductor wafer 10 shown in FIGURE 1 is mounted on the end of the strip 21, as by soldering, for example. As is evident from FIGURE 3, the strip 21 lies below the plane of the upper surface of the arcuate strip 20. The wafer 10 is mounted on the end of the strip 21 so that the contacts 15 and 16 on the top of the wafer 10 lie immediately below the plane of the top surface of the arcuate strip 20.

A plurality of G frames with wafers mounted thereon are located in a mounting jig to facilitate attaching leads to the various contacts 15 and 16. The jig (see FIGURES 4 and 5) consists of a flat plate 30 provided with a series of slots 31 extending parallel to one another and spaced a sufficient distance apart so that a strip 21 can be received in each slot 31 with ample spacing between adjacent G frames. It will be noted that successive G frames are connected together by a web 28. The supporting jig 30 is slidably received in a table 33 and supported by means of a plate 35 attached to the end of a screw 36. The table 33 threadedly engages with the screw 36 and thus provides a simple arrangement for elevating and lowering the supporting jig 30. Bars 38 are located on the marginal portions of table 33 along opposite edges of the supporting jig 30. The two bars 38 are interconnected by any suitable mechanical arrangement for movement together. Rod 39 represents schematically this connection. A pair of wires 40 and 41 have their ends fastened to one of the bars 38 and extend in a parallel relationship across the jig 30 and are received by a means 42 mounted on the other bar 38. Means 42 anchors the other ends of wires 40 and 41 and maintains the wires under slight tension. Any suitable mechanism that can accomplish the intended function is suitable as means 42. For example, springs, set screws or other recognized mechanisms may be employed as the means 42. The wires 40 and 41 are of one mil diameter and are positioned and anchored to be parallel and approximately 4 mils apart, center to center.

Figure 4:
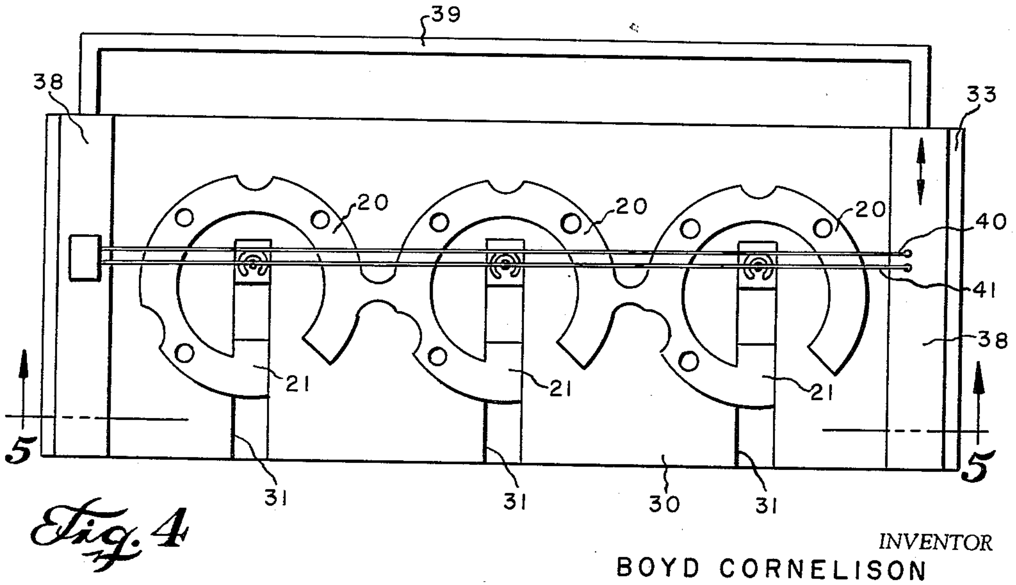
FIGURE 4 is a view in top plan showing in detail the manner of attaching leads to the various regions of a plurality of transistor devices.
Figure 5:
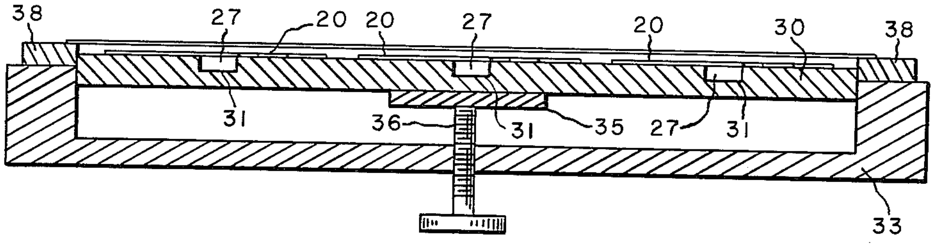
FIGURE 5 is a view in section of FIGURE 4 taken along line 5—5.

With the apparatus in the condition described with respect to FIGURES 4 and 5, the supporting jig 30 is elevated by means of the set screw 36 until the wires 40 and 41 come into contact with the G frames. The bars 38, which are mechanically connected to move together by means 39, are then slid back and forth as indicated by the arrows, see FIGURE 4, with respect to the supporting jig 30 until wire 40 aligns with the contacts 15 and the wire 41 aligns with the contacts 16. Since the wires 40 and 41 are maintained a fixed distance apart substantially equal to the distance between the center of each dot 16 and the center of its associated horseshoe contact 15 aligning one wire with a single contact automatically places both wires 40 and 41 in alignment with all contacts 15 and 16. In this regard it will be appreciated that all of the wafers are indexed with reference to the G frames so that the dots 16 and horseshoe shaped contacts 15 repose at a fixed dimension from an indexing point or line on the G frames. For example, each combination of a dot 16 and contact 15 could be a fixed distance from the free edge of the strip 21 upon which it is mounted. Any indexing point can be chosen as long as the G frames can be inserted into the jig 30 so that all dots 16 and contacts 15 are in substantial alignment.

Thereafter the wires 40 and 41 are joined to the contacts 15 and 16 as by thermo-compression bonding, using chisels or any other conventional means and are also soldered or welded to opposite sides of the arcuate ribbon 20. During or after bonding, while the chisels are still holding the bonds, the wires 40 and 41 are severed between adjacent G frames. This leaves segments of wires bonded at their ends to opposite sides of the G frames and intermediately to a dot or contact. At the same time, these segments are further severed and a portion removed from each between the respective dot or contact and one side of the respective G frame. The severing of the segments for each G frame is accomplished so that the dot and contact of the wafer 10 mounted on the particular G frame are electrically connected to opposite sides of the G frame. The subassemblies are then removed from the supporting jig 30 and the webs 28 between adjacent G frames are severed.

Figure 6:
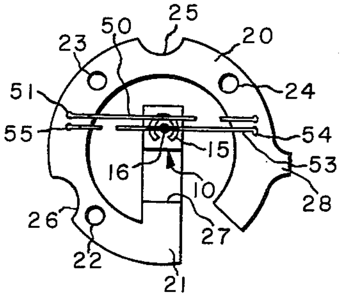
FIGURE 6 is a view of a completed subassembly prior to mounting on a header.

A typical subassembly obtained as above described is illustrated in FIGURE 6. The subassembly consists of the following arrangement. A short segment of wire designated by the numeral 50 is welded or soldered at one end to one side of the arcuate section or ribbon 20 as indicated by the numeral 51 and compression bonded to contact 15. A second short segment of wire indicated by the numeral 53 is soldered or welded at one end to one side of the arcuate strip 20 as indicated by the numeral 54 and compression bonded to dot 16. Numeral 52 represents the severed part of segment 50 that is welded or soldered to the opposite side of the G frame. Likewise numeral 55 represents the severed part of segment 53 that is welded or soldered to the opposite side of the G frame. The mechanical strength of a compression bond is acknowledged as not great. Consequently, it is not feasible or desirable to support a transistor by means of compression bonded leads. In the preferred arrangement and as shown in FIGURE 6, the G frame mechanically supports the wafer 10 and also supports the ends of segments 50 and 53 to relieve as completely as possible any stresses in the bonded attachments or joints of these segments to contacts 15 and 16. By virtue of the described construction, subsequent processing requires no bending of leads 50 and 53 after bonding.

Figure 7:
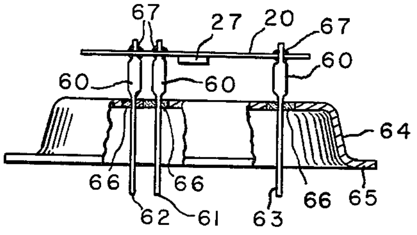
FIGURE 7 is a view of a header partly broken away illustrating the technique for mounting a subassembly thereon.

The subassembly illustrated in FIGURE 6 is now ready to be mounted on a header. For this purpose, the holes 20, 23 and 24 come into play. The G frame is shown as placed onto a three-pin base or header in FIGURE 7. It will be appreciated, however, that the concepts of the invention are equally applicable to the configurations and assemblies requiring a 4 pin, 5 pin or any number pin base or header. The only modification required is to increase the number of holes formed in the arcuate strip 20 to equal the number of pins, and to arrange them correlatively with respect to the pins mounted in the header and wafer lead configuration.

The pins of the header are prepared to receive a G frame by being swaged slightly above the surface of the header. The resulting flattened areas of the several pins are designated by the numeral 60. The pins themselves are designated by the numerals 61, 62 and 63, respectively. The header is of conventional design and consists of a metallic member 64 provided with a plurality of holes, each of which contains a glass or ceramic bead 66. A pin is received through the glass or ceramic bead and is thereby retained in the metallic member 64 in insulating fashion. The metallic member 64 has a flange 65 that functions to facilitate attachment and sealing of a container or can onto the header.

Figure 8:
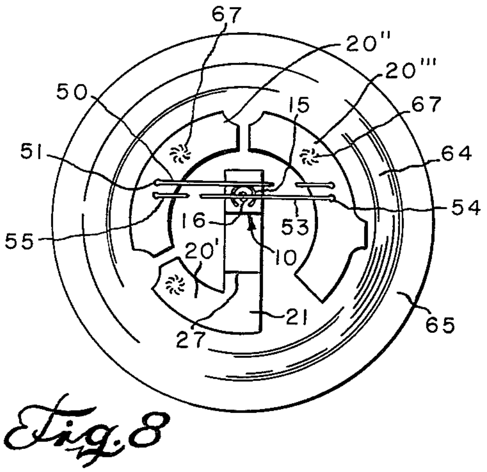
FIGURE 8 is a view in top plan showing the completed assembly prior to enclosure or encapsulation.

The G frame is placed onto the header by having pins 61, 62 and 63 received through holes 22, 23 and 24 respectively. The flattened sections 60 of the pins hold the G frame slightly spaced above the top surface of the metallic member 64. The G frame is then soldered or otherwise electrically connected and mechanically fixed to the pins 61, 62 and 63, as indicated by the numeral 67. Thereafter, the assembly is completed by making various cuts to insulate, in an electrical sense, the various regions of the transistor. Consequently, the arcuate strip 20 is severed in two places, namely at the areas of the cutouts 25 and 26 to divide the strip into three parts 20′, 20″ and 20‴, each individually supported on a pin and spaced from one another. The severing is accomplished by removing small portions of the arcuate strip as is evident from FIGURE 8. The final assembly is portrayed in FIGURES 7 and 8 and is now ready for encapsulation or enclosure in a can.

The "G" frame can be made of any suitable material, but it has been found that a conductor metal is preferred. Hence, nickel, "Kovar," a trade designation for an iron-nickel-cobalt alloy, or other conductor metals are suitable, which can be severed and attached to the pins on the header. The G frames can be produced in strip form connected by webs somewhat in the manner that strips of electrical connectors are fabricated. Non-conductive materials may be used for the G frame but if they are, electrically conductive coating must be placed on selected portions of them. Printed circuit techniques can easily be used to produce a board having the required conductive configuration. Also, it is possible to use a stack of printed boards to produce a multistage package including a plurality of transistor devices. Where non-conductive materials are used, conductive coatings or other means can be employed to complete the necessary electrical contact.

Although the present invention has been shown and described with reference to a single preferred embodiment, nevertheless, it will be appreciated that many changes and modifications are conceivable without departing in principle from the invention. The principal concepts of the present invention are to provide a mechanically strong arrangement for supporting a transistor device adaptable to being produced using mass production techniques. The process of the present invention, which has been described in the foregoing specification, provides a unique series of steps for fabricating transistor assemblies that can be carried out mechanically as opposed to the hand operations now used. Consequently, it is possible by using the techniques offered by the present invention to produce transistor assemblies more reliably and with less rejects. The concept of a supporting frame for handling a transistor device prior to mounting in a header or other support, as taught herein, is believed to be a significant advance in this art.

Since the present invention has been shown and described in terms of a single preferred embodiment, it is appreciated that various changes may occur to those skilled in the art from a knowledge of the teachings contained herein which do not, in fact, depart from the spirit of the invention. It is intended that the following claims be construed and interpreted as covering changes and modifications which are obvious to one skilled in this art.

What is claimed is:

1. A method of making a semiconductor device assembly that comprises the steps of mounting a semiconductor device composed of at least two regions of opposite conductivity on an electrically conductive frame, with one region in contact with one part of said frame and a wire electrically connecting the other region with another part of said frame, mounting the frame on a support, and severing the frame to subdivide it into electrically isolated parts.

2. A method of making a semiconductor device assembly that comprises the steps of mounting a semiconductor wafer composed of at least two regions of opposite conductivity on an electrically conductive ribbon-like frame with one face of said wafer attached to said frame, electrically contacting a wire from a part of the frame to the other face of said wafer, mounting said frame on a conductive support composed of at least two conductive, electrically insulated pins with one said pin in electrical contact with the part of said frame electrically contacted by said wire and the other said pin in electrical contact with the part of said frame to which said wafer is attached, and severing the frame between said parts thereof to isolate them electrically.

3. A method of making a semiconductor device assembly that comprises the steps of mounting a semiconductor wafer composed of at least two regions of opposite conductivity on an electrically conductive ribbon-like frame having an arcuate portion and a tongue portion contiguous therewith, with one face of said wafer attached to said tongue portion, electrically contacting a wire from a part of the arcuate portion of said frame to the other face of said wafer, mounting said frame on a conductive support composed of at least two conductive, electrically insulated pins with one said pin in electrical contact with the part of said arcuate portion electrically contacted by said wire and the other said pin in electrical contact with the part of said arcuate portion contiguous with said tongue portion, and severing the frame between said parts of said arcuate portion to isolate them electrically.

4. A method of making a semiconductor device assembly that comprises the steps of mounting a semiconductor wafer composed of three conductivity regions defining a pair of PN junctions on an electrically conductive ribbon-like frame having an arcuate portion and a tongue portion contiguous therewith, with one face of said wafer attached to said tongue portion, electrically contacting a first wire from a first part of the arcuate portion of said frame to a region on the other face of said wafer, electrically contacting a second wire from a second part of the arcuate portion of said frame to another region on the other face of said wafer, mounting said frame on a conductive support composed of three conductive, electrically insulated pins with a first pin in electrical contact with the first part of said arcuate portion, a second pin in electrical contact with the second part of said arcuate portion, and a third pin in electrical contact with the part of said arcuate portion contiguous with said tongue portion, and severing the frame between said parts of said arcuate portion to isolate them electrically.

References Cited in the file of this patent

UNITED STATES PATENTS

| | | |
|---|---|---|
| 2,725,505 | Webster et al. | Nov. 29, 1955 |
| 2,744,308 | Loman | May 8, 1956 |
| 2,762,001 | Kilby | Sept. 4, 1956 |
| 2,765,516 | Haegele | Oct. 9, 1956 |
| 2,836,878 | Shepard | June 3, 1958 |
| 2,880,383 | Taylor | Mar. 31, 1959 |